United States Patent
Sato et al.

(10) Patent No.: US 6,831,129 B2
(45) Date of Patent: Dec. 14, 2004

(54) RESIN-COATED COPPER FOIL, AND PRINTED WIRING BOARD USING RESIN-COATED COPPER FOIL

(75) Inventors: Tetsuro Sato, Ageo (JP); Tsutomu Asai, Ageo (JP); Toshifumi Matsushima, Ageo (JP)

(73) Assignee: Mitsui Mining & Smelting Co. Ltd., Tokyo (JP)

( * ) Notice: Subject to any disclaimer, the term of this patent is extended or adjusted under 35 U.S.C. 154(b) by 15 days.

(21) Appl. No.: 10/156,339

(22) Filed: May 24, 2002

(65) Prior Publication Data

US 2003/0087101 A1 May 8, 2003

(30) Foreign Application Priority Data

May 31, 2001 (JP) ........................................ 2001-163824

(51) Int. Cl.[7] .......................... B05D 3/02; B32B 15/08; C08L 61/10; C08L 63/00; C09J 163/00
(52) U.S. Cl. .......................... 525/58; 156/330; 427/386; 428/418; 525/123; 525/189; 525/221; 525/454; 525/481; 525/510; 525/524
(58) Field of Search .......................... 525/58, 123, 189, 525/221, 454, 481, 510, 524; 156/330; 427/386

(56) References Cited

U.S. PATENT DOCUMENTS

| 5,718,039 A | 2/1998 | Saida et al. .................... 29/846 |
| 5,800,722 A | 9/1998 | Tsuyoshi et al. .............. 216/13 |

FOREIGN PATENT DOCUMENTS

| JP | 10-237162 A | * 9/1998 |
| JP | 10-251362 A | * 9/1998 |
| JP | 2000-17150 A | * 1/2000 |
| JP | 2000-273280 A | * 10/2000 |

OTHER PUBLICATIONS

Chemical abstracts accession No. 63148–65–2 for Denka Butyral polyvinyl acetals, 1995.*
Oshimi Katsuhiko, et al., "Epoxy Resin Composition and Cured Articles", Patent Abstracts of Japan, Publ. Num. 10–237162, Sep. 8, 1998.

Akatsuka Yasumasa et al., "Novolak Type Resin, Epoxy Resin, Epoxy Resin Composition and Cured Product Thereof", Patent Abstracts of Japan, Publ. Num. 10–251362, Sep. 22, 1998.

Kageyama Yuji, "Copper Foil With Adhesive, Copper Clad Laminate and Printed Wiring Board", Patent Abstracts of Japan, Publ. Num. 2001–003027, Jan. 9, 2001.

* cited by examiner

*Primary Examiner*—Robert Sellers
(74) *Attorney, Agent, or Firm*—Roberts & Roberts, LLP

(57) ABSTRACT

An object of the present invention is to provide a resin-coated copper foil for manufacturing printed wiring boards that excel in total balance of properties of flame retardation, resin flow, water resistance, and peeling strength. The resin-coated copper foil comprises a resin layer on one side of a copper foil, and is characterized in that the resin layer comprises a resin composition having the following composition:

| a. a high polymer having cross-linkable functional groups in the molecule, and a cross-linking agent therefor | 5 to 30 parts by weight |
| b. an epoxy resin that is liquid at room temperature | 5 to 30 parts by weight |
| c. a compound having the structure shown in Formula 1 | 40 to 90 parts by weight |

[Formula 1]

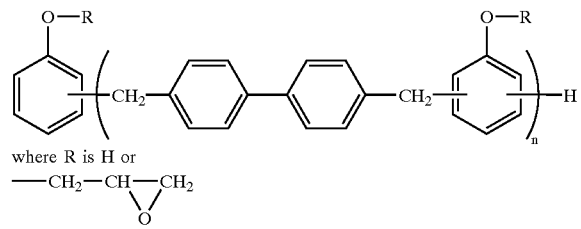

where R is H or
—$CH_2$—$CH$—$CH_2$
          \\ /
           O

16 Claims, No Drawings

RESIN-COATED COPPER FOIL, AND PRINTED WIRING BOARD USING RESIN-COATED COPPER FOIL

TECHNICAL FIELD

The present invention relates to a resin-coated copper foil, and a printed wiring board using the resin-coated copper foil.

BACKGROUND ART

A resin-coated copper foil has widely been used for manufacturing printed wiring boards, because the resin layer thereof constitutes the insulating layer of a printed wiring board that contains no backbone materials, such as glass cloth represented by glass-epoxy prepreg. The resin layer of the heretofore-used resin-coated copper foil is often constituted using an epoxy-based resin composition.

The background of using such a resin composition is that the resin composition has excellent electrical properties and insulating reliability. Also, since the insulating layer of a printed wiring board contains no backbone materials, such as glass cloth, it excels in workability for forming holes when via holes are formed using laser processing, and enables the finished state of the inner walls of the via holes to be fine; therefore, it has frequently been used as a material for multi-layer printed wiring boards formed using a build-up method.

And the epoxy resin then constituting the resin layer of the resin-coated copper foil has been used after adding a flame retardant resin, such as a brominated epoxy resin and TBBA (tetrabromobisphenol A), which is a bromine-based flame retardant, so as not to ignite due to the short-circuiting of an electric circuit to cause fire, and so as to ensure anti-tracking and flame retardant ability.

Using these methods, the epoxy resin and epoxy-resin composition have been made flame retardant, and have been used as the materials constituting the resin layer of the resin-coated copper foil as materials that possess the above-described excellent electrical properties and insulating reliability, and have an excellent self-extinguishing properties.

At the same time, from recent increasing concerns on environmental problems, the elimination of halogen compounds represented by bromine from the epoxy resin has also been studied. This is because halogen compounds may form harmful compounds such as dioxins, unless properly combusted after disposal. In other words, conversion to halogen-eliminated resin compositions, known as "halogen-free resins" has already been carried out in the market.

As the specific methods to form a halogen-free resin, a method in which a flame retardant inorganic filler represented by aluminum hydroxide is added to epoxy resins; a method in which a resin or the like containing red phosphorus, a phosphoric ester, or other phosphorus component is added; or a method in which a nitrogen-containing resin is used as a curing agent of the epoxy resin have been proposed.

However, although a flame-retardant epoxy resin can be manufactured without making the resin composition that constitutes the resin layer of the resin-coated copper foil contain halogens by adopting a method similar to the above-described methods, the following problems exist in each method.

For example, when flame retardation is imparted with the use of an inorganic filler, the cured resin composition tends to become hard and brittle. Therefore, if a printed wiring board is manufactured with the use of a resin-coated copper foil produced by forming a resin layer with this resin composition, the peeling strength of the cured resin layer from the copper foil is significantly lowered, and it becomes difficult to secure bond strength between the copper foil layer and the cured resin layer.

When a phosphorus compound is added, it has been pointed out that the water resistance and heat resistance of the resin are degraded, and there is a problem that the reliability of the printed wiring board lowers. In the case of the method to use a nitrogen-containing resin is used as the curing agent of the epoxy resin, since a resin composition containing a large quantity of nitrogen is used, toxic cyan compounds or $No_x$, which can be the subject of regulating exhaustion, may be produced when the waste is incinerated, as in the case of using halogen compounds, and improvement is demanded.

SUMMARY OF THE INVENTION

The inventors of the present invention have conceived a resin-coated copper foil and a printed wiring board that solve the above-described problems and have excellent electrical properties and insulation reliability as a material for printed wiring boards obtained as a result of repeated examinations.

According to claims, a resin-coated copper foil comprises a resin layer on one side of a copper foil, and is characterized in that the resin layer comprises a resin composition having the following composition. And the resins that constitute the resin composition comprise: a. a high polymer having cross-linkable functional groups in the molecule and a cross-linking agent thereof (5 to 30 parts by weight); b. an epoxy resin that is liquid at room temperature (5 to 30 parts by weight); and c. a compound having a structure shown in Formula 1 (40 to 90 parts by weight).

Here, since the high polymer components in the "high polymer having cross-linkable functional groups in the molecule and a cross-linking agent thereof" must react with the cross-linking agent used in combination to form a three-dimensional structure, they are premised on having cross-linkable functional groups in the molecule. The cross-linkable functional groups used herein may be any one or more of alcoholic hydroxyl groups, carboxyl groups, and phenolic hydroxyl groups. Specifically, the use of any of a polyvinyl acetal resin, a phenoxy resin, carboxyl-group-modified acrylonitrile-butadiene resin, and a polyether sulfone resin is most preferable. The use of a high polymer prepared by blending two or more of these resins is also possible.

The cross-linking agents used in combination with the above-described high polymer include a urethane resin, a phenolic resin, and a melamine resin. The mixing ratio of the polymer component and the cross-linking agent is not to be specifically limited, but can be empirically determined depending on the manufacturing process and the type of the product. Therefore, the present invention was judged to require no specific limitation. Also, about the cross-linking agents used in this time, one cross-linking agent may be used alone, or two or more cross-linking agents may be used in combination at the same time.

The proportion of the above-described high polymer and cross-linking agent should be determined considering the control of resin flow and the inhibition of the generation of resin powder from the end portion of the copper clad laminate during hot pressing in the process of the copper clad laminate using the resin-coated copper foil. As a result of repeated studies by the inventors of the present invention, it was found that when the total quantity of the resin composition is 100 parts by weight, the high polymer having cross-linkable functional groups in the molecule, and a cross-linking agent thereof occupy 5 to 30 parts by weight. If the content is less than 5 parts by weight, resin flow becomes excessively large, and the generation of resin powder from the end portion of the copper clad laminate increases. On the other hand, if the content is more than 30 parts by weight, resin flow becomes small, and defects such as voids are easily produced in the insulating layer of the copper clad laminate.

Next, the "epoxy resin that is liquid at room temperature" is used for securing anti-cracking properties required for the resin-coated copper foil. That is, strictly speaking, the resin-coated copper foil is a copper foil having a resin layer on one side thereof. And the resin layer is to constitute an insulating layer when a printed wiring board is manufactured using the resin-coated copper foil. Therefore, the resin layer in the state of the resin-coated copper foil is in a partly cured state, and is completely cured by hot pressing for processing to a copper clad laminate. When an epoxy resin that is liquid at room temperature is used as a constituting material for the resin composition, significant improvement of anti-cracking properties to prevent cracking that occurs on the resin layer in the partly cured state is expected.

As the specific compounds that fall in the "epoxy resins that are liquid at room temperature", the use of bisphenol-A-type, bisphenol-F-type, and bisphenol-AD-type compounds are preferable. The use of these resins is preferable, because the insulating layer obtained by processing into a copper clad laminate using a resin-coated copper foil has excellent insulation reliability, and has favorable physical properties.

The epoxy resin that is liquid at room temperature occupies 5 to 30 parts by weight when the total quantity of the resin composition is 100 parts by weight. If the content is less than 5 parts by weight, resin cracking is easily produced. On the other hand, if the content is more than 30 parts by weight, the surface of the resin becomes adhesive at room temperature, and handling becomes difficult.

The "compound having the structure shown in Formula 1" is a compound having the structure shown in formula 1.

Formula 1

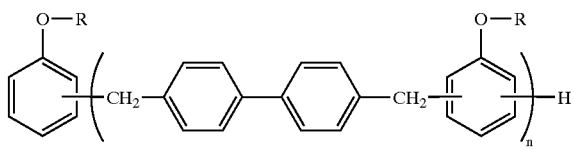

where R is H or

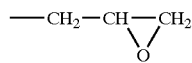

and n=1 to 10,
wherein said compound is present in the resin composition in an amount of from 40 to 90 parts by weight of the resin composition. The compound having the structure shown in Formula 1 excels in flame retardation by itself. When this resin is contained in the resin composition, practically sufficient flame retardation can be obtained without adding other special flame retardant agents. When R is H, it is a phenolic compound that acts as a curing agent for the epoxy resin. When it is used as a phenolic compound, it may be used as the curing agent of the above-described b, and when it is used in the state of an epoxy resin, an ordinary curing agent for the epoxy resin can be used. Furthermore, these phenolic compound and epoxy resin can be used in combination.

The "compound having the structure shown in Formula 1"occupies 40 to 90 parts by weight when the total quantity of the resin composition is 100 parts by weight. If the content is less than 40 parts by weight, flame retardation cannot be ensured, and if the content is more than 90 parts by weight, the use of the minimum quantities necessary for exerting the effect of adding the "high polymer having cross-linkable functional groups in the molecule, and a cross-linking agent thereof" and the "epoxy resins that are liquid at room temperature" components, which are other components used in combination, becomes impossible.

The components other than the "high polymer having cross-linkable functional groups in the molecule, and a cross-linking agent thereof", and the "epoxy resins that are liquid at room temperature" and the "compound having the structure shown in Formula 1" can be used within the range not deviating from the spirit of the present invention. Specifically, these include an anti-foaming agent, a leveling agent, and a coupling agent; and the addition of these agents may contribute to the improvement of the resin-coated copper foil and the surface characteristics, and the improvement of adhesion between the copper foil and the resin layer.

The above-described resin composition is generally dissolved in a solvent such as methyl ethyl ketone, applied to the one side of a copper foil, and heated and dried to form a resin-coated copper foil. This resin-coated copper foil is used in the same manner as in ordinary copper foils to manufacture a copper clad laminate, and using this copper clad laminate, a printed wiring board can be obtained by etching and the like. For example, a resin-coated copper foil according to the present invention is laminated on a predetermined inner-layer core material, and hot-pressed, and through processes such as circuit formation and the via-hole formation by laser, a multi-layer printed wiring board is obtained. Then, in claim 4, a printed wiring board is manufactured using a resin-coated copper foil described in claims 1 to 3.

BEST MODE FOR CARRYING OUT THE INVENTION

The present invention will be described in more detail below through the embodiments of the present invention.

Embodiment 1

EPOMIK R-140 (Mitsui Chemicals, Inc.), a trade name of a bisphenol-A-type epoxy resin, as an epoxy resin of the component b in the claim, and NC-3000P (NIPPON KAYAKU CO., LTD.), trade name of an epoxy resin R whereof is a glycidyl group, as the component c in claim 1, were mixed in a weight ratio of 40:60.

A 25% dicyanodiamide solution in dimethylformamide was added at 6 parts by weight in terms of dicyanodiamide, as a curing agent for the epoxy resin; and Curezol 2P4MZ (Shikoku Corp.), as an epoxy-resin curing accelerator was added 1 part by weight to the above-described epoxy resin; and the mixture was dissolved in dimethylformamide to form a solution of the solid content of 50% by weight (the product obtained in this stage is called the "epoxy resin compound").

To this compound, a high polymer having cross-linkable functional groups in the molecule corresponding to the component a described in the claim, and Denka Butyrl 5000A (DENKI KAGAKU KOGYO KABUSHIKI KAISHA), which is a trade name for a polyvinyl acetal resin, and Colonate AP Staple (NIPPON POLYURETHANE INDUSTRY CO., LTD.), a trade name for a urethane resin as cross-linking agents therefor were added.

The resin composition at this stage comprised 80 parts by weight of the epoxy resin compound (as solid matter), 17 parts by weight of the polyvinylacetal resin, and 3 parts by weight of the urethane resin; and the total solid content was adjusted to be 30% by weight with the use of a mixed solvent of toluene:methanol=1:1. Here, the content of the component c described in the claim became 43 parts by weight.

The above-described resin composition was applied to the nodular surface of an electrodeposited copper foil of a nominal thickness of 18 μm, dried in the air, and heated at 130° C. for 5 minutes to obtain a resin-coated copper foil having a resin layer in the partly cured state. The thickness of the resin layer at this time was made 100 to 105 μm. The resin-coated copper foil was subjected to heat treatment under normal pressure at 150° C. for 4 hours, and after cooling, the copper foil was etched off to obtain a cured resin film.

The above-described resin-coated copper foil was adhered to both sides of an FR-4 inner-layer core material, which is a double-sided printed wiring board having predetermined circuits formed thereon, with a thickness of the used outer-layer copper coil of 35 μm, and a thickness of the insulating layer of 0.5 mm. On adhering, a resin-coated copper foil was laminated on an inner-layer core material so that the resin layer of the resin-coated copper foil contacted the inner-layer core material, and pressed under a pressure of 20 kgf/cm$^2$ at a temperature of 170° C. for 2 hours, to manufacture a copper clad laminate comprising 4 copper foil layers.

Embodiment 2

A resin-coated copper foil, a cured resin film, and a multi-layer printed wiring board were manufactured in the same method as in Embodiment 1, except that the epoxy resin compound and the epoxy resin curing agent used in Embodiment 1 were changed to the following:

As an epoxy resin of the component b in the claim, EPOMIK R-140 (Mitsui Chemicals, Inc.), a trade name of a bisphenol-A-type epoxy resin, and EPPN-201 (NIPPON KAYAKU CO., LTD.), trade name of a novolak-type epoxy resin were mixed in a weight ratio of 50:50.

And as an epoxy-resin curing agent, the component c in the claim, in which R is H, a phenolic compound (hereafter referred to as a "compound A") was used, and the above-described epoxy resin and compound A were mixed so that (the weight of the epoxy resin):(the weight of compound A) became 40:60.

Furthermore, as an epoxy-resin curing accelerator, 1 part by weight of Curezol 2P4MZ (Shikoku Corp.) was added to the epoxy resin, and the mixture was dissolved in methyl ethyl ketone to a solution of a solid content of 50% by weight. Here, the content of the component c (compound A) described in the claim 1 became 43 parts by weight (as solid matter).

Embodiment 3

Embodiment 3 is identical to Embodiment 1 except that the component c in the claim, in which R is H, a phenolic compound (compound A) was used as the epoxy-resin curing agent used in Embodiment 1, and the epoxy resin and compound A were mixed so that (the weight of the epoxy resin):(the weight of compound A) became 50:50.

That is, EPOMIK R-140 (Mitsui Chemicals, Inc.), a trade name of a bisphenol-A-type epoxy resin, as an epoxy resin of the component b in the claim, and NC-3000P (NIPPON KAYAKU CO., LTD.), trade name of an epoxy resin R whereof is a glycidyl group, as the component c in the claim, were mixed in a weight ratio of 40:60.

As a curing agent for the epoxy resin, 50 parts by weight of the compound A was added to the above-described epoxy resin. Furthermore, 1 part by weight of Curezol 2P4MZ (Shikoku Corp.), as an epoxy-resin curing accelerator was added to the above-described epoxy resin; and the mixture was dissolved in methyl ethyl ketone to form a solution of the solid content of 50% by weight.

To this solution, a high polymer having cross-linkable functional groups in the molecule corresponding to the component a described in the claim, and Denka Butylal 5000A (DENKI KAGAKU KOGYO KABUSHIKI KAISHA), which is a trade name for a polyvinyl acetal resin, and Colonate AP Staple (NIPPON POLYURETHANE INDUSTRY CO., LTD.), a trade name for a urethane resin as cross-linking agents therefor were added. And the total solid content was adjusted to be 30% by weight using a mixed solvent of toluene:methanol=1:1. Here, the content of the component c described in claim 1 (compound A) became 63 parts by weight (as solid matter).

Comparative Examples 1 to 4 for verifying the effect of the present invention will be described below comparing to the present invention.

COMPARATIVE EXAMPLE 1

From the resin used in Embodiment 3, the polyvinyl acetal resin and the urethane resin were removed, and a resin-coated copper film, a cured resin film, and a multi-layer printed wiring board were manufactured in the same method as in Embodiment 1.

COMPARATIVE EXAMPLE 2

The compound A in the resin used in Embodiment 3 was substituted by TD-2090 (DAINIPPON INK AND CHEMICALS, INCORPORATED), a trade name of a phenol novolak resin, and a resin-coated copper film, a cured resin film, and a multi-layer printed wiring board were manufactured in the same method as in Embodiment 1.

COMPARATIVE EXAMPLE 3

The compounding ratio of the same materials used in Embodiment 3 was changed as described below, and a resin-coated copper film, a cured resin film, and a multi-layer printed wiring board were manufactured in the same method as in Embodiment 1.

That is, the resin used here was prepared through the following procedures. EPOMIKR-140 (Mitsui Chemicals, Inc.), a trade name of a bisphenol-A-type epoxy resin, as an epoxy resin of the component b in the claim, and NC-3000P (NIPPON KAYAKU CO., LTD.), trade name of an epoxy resin R whereof is a glycidyl group, as the component c in the claim, were mixed in a weight ratio of 40:60.

As a curing agent for the epoxy resin, 50 parts by weight of the compound A was added to the above-described epoxy resin. Furthermore, 1 part by weight of Curezol 2P4MZ (Shikoku Corp.), as an epoxy-resin curing accelerator, was added to the above-described epoxy resin; and the mixture was dissolved in methyl ethyl ketone to form a solution of the solid content of 50% by weight (the product obtained in this stage is called the "epoxy resin compound").

To this compound, a high polymer having cross-linkable functional groups in the molecule corresponding to the component a described in the claim, and Denka Butyral 5000A (DENKI KAGAKU KOGYO KABUSHIKI KAISHA), which is a trade name for a polyvinyl acetal resin, and Colonate AP Staple (NIPPON POLYURETHANE INDUSTRY CO., LTD.), a trade name for a urethane resin as cross-linking agents therefor were added. The resin composition at this stage was 60 parts by weight of the epoxy resin compound (as solid matter), 37 parts by weight of the polyvinylacetal resin, and 3 parts by weight of the urethane resin; and the total solid content was adjusted to be 30% by weight using a mixed solvent of toluene:methanol= 1:1.

COMPARATIVE EXAMPLE 4

In place of the epoxy resin compound and the epoxy-resin curing agent used in Embodiment 1, a phosphorus-modified epoxy resin synthesized as described below was used. The phosphorus-modified epoxy resin was synthesized through the reaction of HCA (9,10-dihydro-9-oxa-10-phosphaphenanthrene-10-oxide) having the structural formula shown in Formula 2, and a novolak-type epoxy resin. The phosphorus content of the phosphorus-modified epoxy resin was 3%. The phosphorus-modified epoxy resin was mixed with EPOMIK R-140 (Mitsui Chemicals, Inc.), which is an epoxy resin of the component b in the claim, in a ratio of 65:35. And a 25% dicyanodiamide solution in dimethylformamide was added at 6 parts by weight in terms of dicyanodiamide, as a curing agent for the epoxy resin; and 1 part by weight of Curezol 2P4MZ (Shikoku Corp.) was added as an epoxy-resin curing accelerator to the above-described epoxy resin; and the mixture was dissolved in dimethylformamide to form a solution of the solid content of 50% by weight. Other conditions or the like are same as in Embodiment 1.

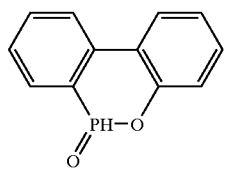

[Formula 2]

The mixing ratio at this time was (commercially available phosphorus-modified epoxy):(novolak-type epoxy resin)= 35:65 (weight ratio). Other conditions or the like are same as described in Embodiment 1, and a resin-coated copper film, a cured resin film, and a multi-layer printed wiring board were obtained.

The products obtained from the above-described examples and comparative examples were compared, and the effect of the resin-coated copper foil according to the present invention was verified. First, the flame-out tests were conducted, as an indicator of flame retardation, with the use of the resin films obtained from the above-described examples and comparative examples. The testing method was based on UL 94 of the UL Standards, and the flame-out time, which is the time until the flame extinguishes after each of 5 specimens ignites, and the total flame-out time after 10 ignitions were measured. The results are shown in Table 1.

TABLE 1

| Specimen | Average flame-out time (sec.) | Total flame-out time (sec.) | Evaluation |
|---|---|---|---|
| Embodiment 1 | 14 | 85 | UL 94V-1 passed |
| Embodiment 2 | 16 | 95 | UL 94V-1 passed |
| Embodiment 3 | 11 | 66 | UL 94V-1 passed |
| Comparative example 1 | 15 | 82 | UL 94V-1 passed |
| Comparative example 2 | 30 or longer | 120 or longer | UL 94V-1 failed |
| Comparative example 3 | 18 | 102 | UL 94V-1 passed |
| Comparative example 4 | 9 | 46 | UL 94V-0 passed |

As seen from the results shown in Table 1, each of Embodiment 1 to Embodiment 3, Comparative Example 1, and Comparative Example 3 satisfies the UL 94V-1 standard. Comparative Example 4 satisfies the UL 94V-0 standard. However, the resin for using in a printed wiring board cannot be determined to be usable only from short flame-out time. All the characteristics shown below must be satisfied.

Next, a resin-coated copper foil was fabricated, and the resin flow when pressing into a copper clad laminate was measured. Since gas incorporated in the resin is released by the resin flow while flowing, and the interlayer adhesion when pressed into a copper clad laminate is ensured, an adequate resin flow is required. That is, excessively small or excessively large resin flow is not preferable. The measurement of resin flow is conducted in accordance with MIL-13949G, and the thickness of the insulating layer after pressing was measured at 30 points to obtain the distribution width. The results are shown in Table 2.

TABLE 2

| Specimen | Resin flow (%) | Distribution of insulation layer thickness after pressing ($\mu$m) |
|---|---|---|
| Embodiment 1 | 18 | 55–66 |
| Embodiment 2 | 18 | 57–71 |
| Embodiment 3 | 20 | 51–61 |
| Comparative example 1 | 56 | 20–54 |
| Comparative example 2 | 15 | 60–72 |
| Comparative example 3 | 2 | 75–80 |
| Comparative example 4 | 21 | 55–63 |

The most appropriate resin flow is said to be about 20%, and the resin flow of Embodiment 1 to Embodiment 3 is 18% to 20%, which shows very preferable results. Furthermore, the resin flow of Comparative Example 4 is also favorable. Whereas, the resin flow of Comparative Example 1 to Comparative Example 3 is excessively large or excessively small.

Next, the water absorption of the resin, which is an index of water resistance, was measured in accordance with JIS C6481. The higher water absorption is, the easier delamination due to thermal shock occurs between layers when processed into a printed wiring board; therefore, water absorption is preferably as low as possible. The results of measurements of water absorption are shown in Table 3.

TABLE 3

| Specimen | Water absorption (%) |
|---|---|
| Embodiment 1 | 1.1 |
| Embodiment 2 | 1.5 |
| Embodiment 3 | 0.8 |
| Comparative example 1 | 0.7 |
| Comparative example 2 | 1.2 |
| Comparative example 3 | 1.9 |
| Comparative example 4 | 2.6 |

As seen from the results shown in Table 3, the water absorption of the most products is 2.0% or less, indicating considerably favorable results. Only Comparative Example 4 shows the value as high as 2.6%, the highest of the products.

Furthermore, the results of measurements of circuit peeling strength after processing into a printed wiring board will be described. The outer layer copper foil of the manufactured multi-layer printed wiring board was etched to form a circuit of a width of 10 mm, and the peeling strength thereof was measured. The results are shown in Table 4.

TABLE 4

| Specimen | Peeling strength (kgf/cm) |
|---|---|
| Embodiment 1 | 1.3 |
| Embodiment 2 | 1.2 |
| Embodiment 3 | 1.2 |
| Comparative example 1 | 1.0 |
| Comparative example 2 | 1.1 |
| Comparative example 3 | 1.2 |
| Comparative example 4 | 1.2 |

As seen from the results shown in Table 4, it is known that the peeling strength of Embodiment 1 to Embodiment 3 does not fall to 1.2 kgf/cm or below, and exhibits the same as or better than the comparative examples.

From the above results, it is known that the resin-coated copper foil according to the present invention meets each of the above-described properties, and the quality that excels in the total balance when processed into a printed wiring board is ensured. On the contrary, the resin-coated copper foils used as comparative examples do not satisfy expected quality for some of the above-described properties, and lack in the total balance.

INDUSTRIAL APPLICABILITY

A printed wiring board manufactured with the use of a resin-coated copper foil according to the present invention has the quality that excels in the total balance of flame-out properties, resin flow, water absorption, and peeling strength. Imparting such a quality to a printed wiring board enables the supply of products that excel in flame resistance, and have high reliability.

What is claimed is:

1. A resin-coated copper foil comprising a resin layer on one side of a copper foil, wherein said resin layer comprises a resin composition having the following composition:
   a. a high polymer having cross-linkable functional groups in the molecule and a cross-linking agent therefor, which high polymer is present in the resin composition in an amount of from 5 to 30 parts by weight when the total quantity of the resin composition is 100 parts by weight;
   b. an epoxy resin that is liquid at room temperature which epoxy resin is present in the resin composition in an amount of from 5 to 30 parts by weight when the total quantity of the resin composition is 100 parts by weight; and
   c. a compound having the structure shown in Formula 1:

Formula 1

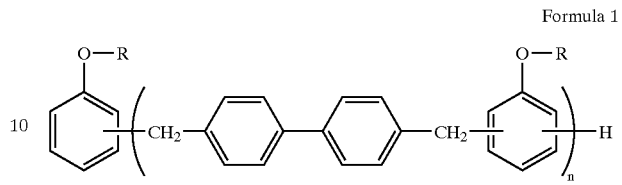

where R is H or

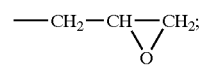

and n=1 to 10,
wherein said compound is present in the resin composition in an amount of from 40 to 90 parts by weight when the total quantity of the resin composition is 100 parts by weight.

2. The resin-coated copper foil according to claim 1, wherein the high polymer having cross-linkable functional groups in the molecule are either one of, or a mixture of two or more of a polyvinyl acetal resin, a phenoxy resin, a polyether sulfone resin, and a carboxyl-group-modified acrylonitrile-butadiene resin.

3. The resin-coated copper foil according to claim 1, wherein the epoxy resin that is liquid at room temperature is an epoxy resin of either one of, or a mixture of two or more of a bisphenol A, a bisphenol F, and a bisphenol AD.

4. A resin-coated copper foil comprising a resin layer coated onto one side of a copper foil, wherein said resin layer comprises a resin composition comprising:
   a) a high polymer comprising cross-linkable functional groups and a cross-linking agent;
   b) an epoxy resin that is present in a liquid state at room temperature which epoxy resin is present in the resin composition in an amount of from 5 to 30 parts by weight when the total quantity of the resin composition is 100 parts by weight; and
   c) a compound having the structure shown in Formula 1:

Formula 1

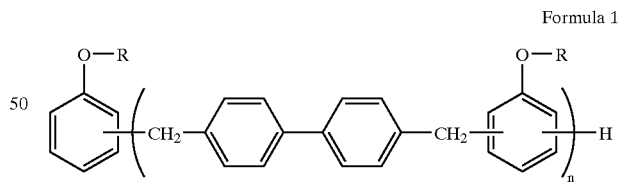

where R is H or

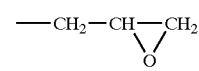

and n=1 to 10.

5. The resin-coated copper foil of claim 4 wherein the high polymer is present in the resin composition in an amount of from 5 to 30 parts by weight when the total quantity of the resin composition is 100 parts by weight.

6. The resin-coated copper foil of claim 1, wherein the high polymer comprises a cross-linkable functional group selected from the group consisting of alcoholic hydroxyl groups, carboxyl groups, phenolic hydroxyl groups, and combinations thereof.

7. The resin-coated copper foil of claim 6 wherein the high polymer having a cross-linkable functional group is selected from the group consisting of polyvinyl acetal resins, phenoxy resins, polyether sulfone resins, carboxyl-group-modified acrylonitrile-butadiene resins, and combinations thereof.

8. The resin-coated copper foil of claim 1 wherein the high polymer comprises a cross-linking agent selected from the group consisting of urethane resins, phenolic resins, melamine resins, and combinations thereof.

9. The resin-coated copper foil of claim 1, wherein the epoxy resin is selected from the group consisting of bisphenol A epoxy resins, bisphenol F epoxy resins, bisphenol AD epoxy resins, and combinations thereof.

10. The resin-coated copper foil of claim 4, wherein the compound of Formula 1 is present in the resin composition in an amount of from 40 to 90 parts by weight when the total quantity of the resin composition is 100 parts by weight.

11. The resin-coated copper foil of claim 1 wherein, in Formula 1, R is hydrogen.

12. The resin-coated copper foil of claim 1 wherein, in Formula 1, R is:

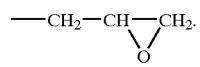

13. The resin-coated copper foil of claim 1 wherein said resin composition is halogen free.

14. A process for forming a resin-coated copper foil which comprises the steps of:
   i) forming a resin composition comprising:
      a) a high polymer comprising cross-linkable functional groups and a cross-linking agent;
      b) an epoxy resin that is present in a liquid state at room temperature which epoxy resin is present in the resin composition in an amount of from 5 to 30 parts by weight when the total quantity of the resin composition is 100 parts by weight; and
      c) a compound having the structure shown in Formula 1:

Formula 1

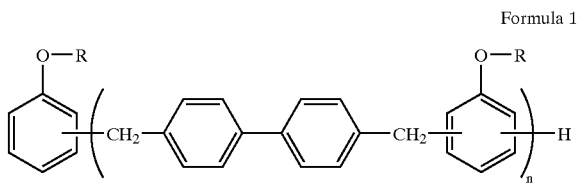

where R is H or

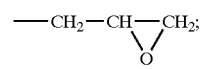

and n=1 to 10,
   ii) dissolving the resin composition in a solvent;
   iii) applying the dissolved resin composition onto a side of a copper foil;
   iv) drying the resin composition; and
   v) curing the resin composition, to thereby form a resin-coated copper foil.

15. A process for forming a multi-layer printed wiring board, comprising the steps of:
   i) forming a resin composition comprising:
      a) a high polymer comprising cross-linkable functional groups and a cross-linking agent;
      b) an epoxy resin that is present in a liquid state at room temperature which epoxy resin is present in the resin composition in an amount of from 5 to 30 parts by weight when the total quantity of the resin composition is 100 parts by weight; and
      c) a compound having the structure shown in Formula 1:

Formula 1

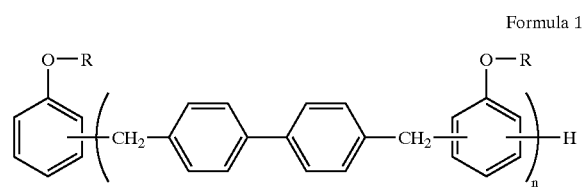

where R is H or

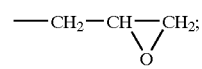

and n=1 to 10,
   ii) dissolving the resin composition in a solvent;
   iii) applying the dissolved resin composition onto a side of a copper foil;
   iv) drying the resin composition;
   v) curing the resin composition, to thereby form a resin-coated copper foil; and
   vi) laminating the resin-coated copper foil onto an inner-layer core material, to thereby form a multi-layer printed wiring board.

16. The process of claim 14 wherein the solvent in step (ii) comprises methyl ethyl ketone.

* * * * *